(12) United States Patent
Kuo et al.

(10) Patent No.: US 10,199,333 B2
(45) Date of Patent: Feb. 5, 2019

(54) DELAMINATION-RESISTANT SEMICONDUCTOR DEVICE AND ASSOCIATED METHOD

(71) Applicant: OmniVision Technologies, Inc., Santa Clara, CA (US)

(72) Inventors: Ying-Chih Kuo, Hsinchu (TW); Ying Chung, Taichung (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 5 days.

(21) Appl. No.: 15/642,132

(22) Filed: Jul. 5, 2017

(65) Prior Publication Data

US 2019/0013279 A1 Jan. 10, 2019

(51) Int. Cl.
*H01L 23/00* (2006.01)
*H01L 27/146* (2006.01)

(52) U.S. Cl.
CPC ...... *H01L 23/562* (2013.01); *H01L 27/14632* (2013.01); *H01L 27/14687* (2013.01)

(58) Field of Classification Search
CPC ............. H01L 23/562; H01L 27/14687; H01L 27/14632
See application file for complete search history.

(56) References Cited

U.S. PATENT DOCUMENTS

| | | | | |
|---|---|---|---|---|
| 7,452,743 | B2 * | 11/2008 | Oliver | H01L 23/552 257/E23.114 |
| 8,901,701 | B2 * | 12/2014 | Lin | H01L 21/76898 257/522 |
| 9,362,134 | B2 * | 6/2016 | Lin | H01L 21/76898 |
| 9,659,900 | B2 * | 5/2017 | Ying | H01L 23/5384 |
| 2007/0045632 | A1 * | 3/2007 | Oliver | H01L 23/552 257/79 |
| 2010/0244172 | A1 * | 9/2010 | Borthakur | H01L 27/14618 257/435 |
| 2013/0121007 | A1 * | 5/2013 | Yu | H01L 33/486 362/382 |
| 2014/0239979 | A1 * | 8/2014 | Wygant | B81B 7/007 324/658 |
| 2017/0261490 | A1 * | 9/2017 | Hebestreit | G06K 7/10821 |
| 2018/0038841 | A1 * | 2/2018 | Lisec | B81C 1/00087 |
| 2018/0162725 | A1 * | 6/2018 | Shen | B81C 1/00246 |

FOREIGN PATENT DOCUMENTS

CN 103000648 A 3/2013

\* cited by examiner

*Primary Examiner* — Victor A Mandala
(74) *Attorney, Agent, or Firm* — Lathrop Gage LLP

(57) ABSTRACT

A delamination-resistant semiconductor device includes a conductive layer, a semiconductor layer, and a spacer. The conductive layer has a first side opposite a second side. The semiconductor layer is on the first side and defines an aperture therethrough spanned by the conductive layer. The spacer is on the second side and has a top surface, proximate the conductive layer, that defines a blind hole spanned by the conductive layer. A method for preventing delamination of a multilayer structure, includes a step of disposing a first layer on a substrate such that the first layer spans an aperture of the substrate. The method also includes a step of disposing a second layer on the first layer. The second layer has a blind hole adjacent to the first layer such that the first layer spans the blind hole.

17 Claims, 4 Drawing Sheets

DELAMINATION-RESISTANT SEMICONDUCTOR DEVICE AND ASSOCIATED METHOD

BACKGROUND

Mobile devices, motor vehicles, and other consumer electronics products often include at least one camera. The camera includes an image sensor that is manufactured, with hundreds of additional identical image sensors, on a single image-sensor wafer via a wafer-level manufacturing process. The image-sensor wafer has several layers, some of which are prone to delamination during the manufacturing process. Such wafer-level delamination often results in one or more of the wafer's image sensors being inoperable.

DETAILED DESCRIPTION OF THE EMBODIMENTS

Figure 1:
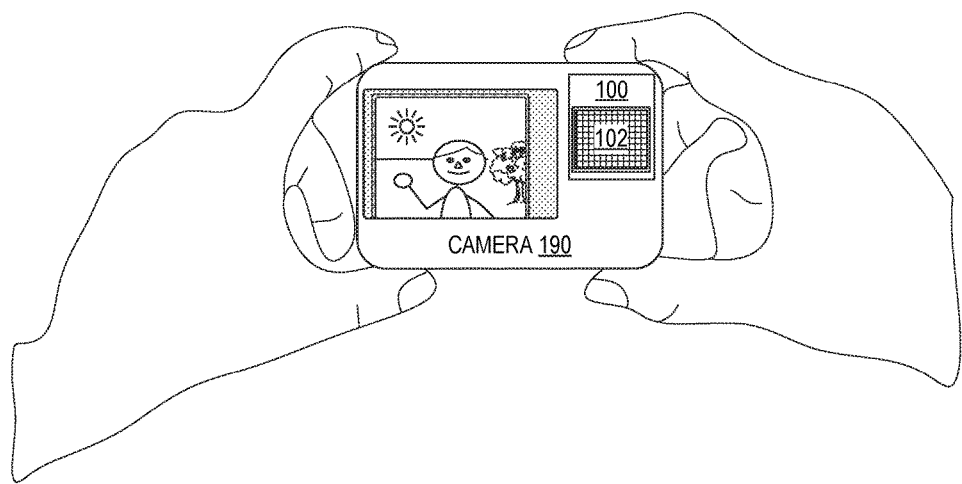
FIG. 1 depicts a camera that includes an image sensor, the image sensor being an embodiment of a delamination-resistant semiconductor device.
Figure 2:
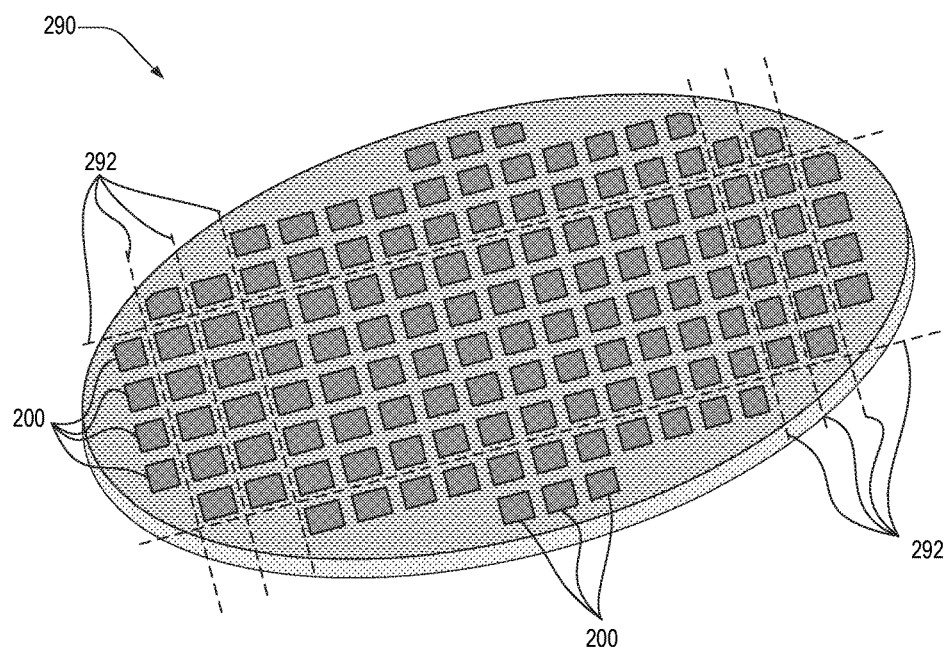
FIG. 2 is a perspective view of an image-sensor wafer that includes a plurality of image sensors of FIG. 1, in an embodiment.

FIG. 1 depicts a camera 190 imaging a scene. Camera 190 includes an image sensor 100 having a pixel array 102. FIG. 2 is a perspective view of an image-sensor wafer 290 that includes a plurality of undiced image sensors 200. Individual image sensors 100 may be obtained by dicing image-sensor wafer 290 along dicing planes 292.

Figure 3:
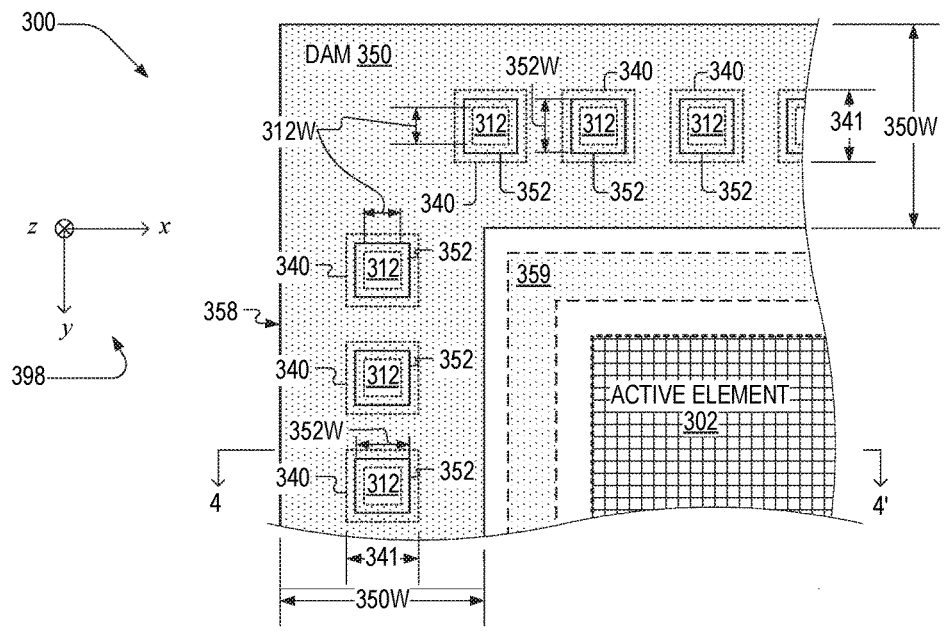
FIGS. 3 and 4 are respective cross-sectional views of part of a delamination-resistant semiconductor device, in an embodiment.
Figure 4:
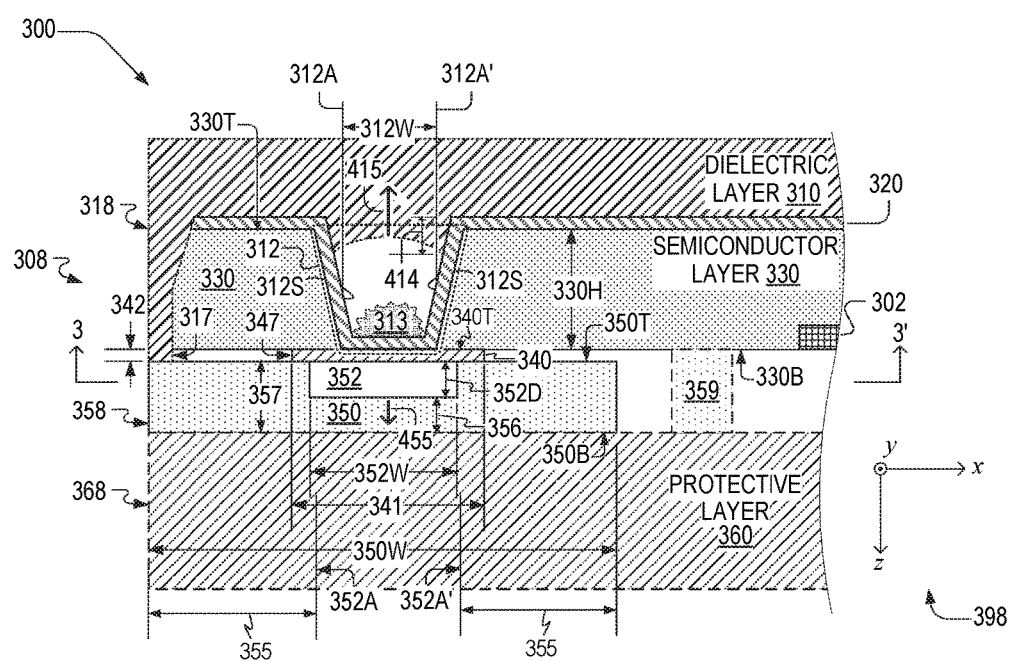

FIGS. 3 and 4 are respective cross-sectional views of part of delamination-resistant semiconductor device 300. Image sensor 100 is an example of delamination-resistant semiconductor device 300. The cross-sectional view of FIG. 3 is along cross-section 3-3' of FIG. 4. The cross-sectional view of FIG. 4 is along cross-section 4-4' of FIG. 3. With respect to a coordinate system 398 that defines directions x, y, and z, cross-section 3-3' is parallel to the x-y plane and cross-section 4-4' is parallel to the x-z plane. FIGS. 3 and 4 are best viewed together in the following description.

Delamination-resistant semiconductor device 300 includes a semiconductor layer 330, a conductive stack 340, and a dam 350. Device 300 may also include a protective layer 360, such that dam 350 functions as a spacer between conductive stack 340 and protective layer 360. Dam 350 has a bottom surface 350B and a top surface 350T. Conductive stack 340 is on top surface 350T. Semiconductor device 300 may also include an inner dam 359, which functions as a spacer between semiconductor layer 330 and protective layer 360.

Semiconductor layer 330 has a top surface 330T opposite a bottom surface 330B that are separated by a thickness 330H. Thickness 330H is between 100 μm and 150 μm, for example. Semiconductor layer 330 includes an active element 302, which may correspond to pixel array 102 (FIG. 1), such that delamination-resistant semiconductor device 300 is an image sensor. In an embodiment, active element 302 is a display-pixel array, such that delamination-resistant semiconductor device 300 is a display device, such as liquid-crystal on silicon display. While active element 302 does not intersect cross-section 3-3', FIG. 3 illustrates active element 302 for illustrative purposes.

Delamination-resistant semiconductor device 300 has an edge 308 defined at least in part by a surface 358 of dam 350 and, when included, a surface 318 of dielectric layer 310 and a surface 368 of protective layer 360. Penetration of moisture through edge 308 may cause device 300 to malfunction, e.g., via a short-circuit, reduction of transparency of protective layer 360, or light scattering off of moisture accumulated on active element 302.

Semiconductor layer 330 also includes a plurality of apertures 312 (or vias) that each span surfaces 330B and 330T. Each aperture 312 is defined by a surface 312S of semiconductor layer 330. At bottom surface 330B, one or more apertures 312 have an aperture width 312W. One or more adjacent apertures 312 may be merged into one oblong aperture without departing from the scope hereof. For example, delamination-resistant semiconductor device 300 may include four oblong apertures each oriented parallel to a respective side of pixel array 102.

Conductive stack 340 has a stack width 341, thickness 342, and may include a plurality of conductive layers (e.g., a stack of conductive layers) with dielectric layers therebetween, wherein each conductive layer is electrically connected to one or more pixels of pixel array 102. Stack width 341 is may be between 80 μm and 100 μm, for example. Thickness 342 is less than 3 μm, for example.

Delamination-resistant semiconductor device 300 may also include at least one of a dielectric layer 310 and a conductive redistribution layer (RDL) 320. RDL 320 is electrically connected to conductive stack 340 at a top surface 340T thereof. Dielectric layer 310 extends a distance 414 into the center of aperture 312 with respect to top surface 330T. Distance 414 is, for example, between ten and twenty-five micrometers.

Semiconductor layer 330 may be formed of silicon or other semiconductor material such as a silicon-germanium alloy. Protective layer 360 may be a cover glass. Dielectric layer 310 and dam 350 may be formed of a solder mask material such as a polyimide or other polymer. Dielectric layer 310 and dam 350 may be formed of the same material, in which case device 300 benefits from dielectric layer 310 and dam 350 having same thermal properties, such as expansion coefficient.

Dam 350 has a dam width 350W and an outer-dam thickness 357 between surface 350B and 350T. Dam 350 includes a recess 352, which has a recess width 352W and a recess depth 352D. Dam width 350W exceeds stack width 341 by a factor of twenty, for example. Dam 350 has a sidewall width 355, such that in cross-section 4-4', dam width 350W exceeds recess width 352W by twice sidewall width 355. Recess 352 may be a blind hole in top surface 350T. Outer-dam thickness 357 exceeds recess depth by an inner-dam thickness 356. Absent recess 352, dam 350 and conductive stack 340 are prone to cracking and/or delamination caused by factors such as material stress 415 of dielectric layer 310 and material stress 455 of dam 350. An additional factor is stress caused when debris 313 from dielectric layer 310 collects on the bottom of aperture 312.

Table 1 lists example ranges of aperture width 312W, recess depth 352D, recess width 352W, sidewall width 355, inner-dam thickness 356, and outer-dam thickness 357. Embodiments are not limited to ranges disclosed in Table 1. In the embodiment of semiconductor device 300, recess width 352W exceeds aperture width 312W. For example, width 352W exceeds aperture width 312W by a factor of 1.2±0.1 when stack width 341 is 80±5 μm and by a factor of 1.6±0.1 when stack width 341 is 100±5 μm. Aperture width 312W may exceed recess width 352W without departing from the scope hereof. One function of dam 350 and inner dam 359 (when included) is to prevent moisture from reaching other electronic components of delamination-resistant semiconductor device 300, such as pixel array 102.

TABLE 1

Example dimensions of selected elements of delamination-resistant semiconductor device 300

| dimension | typical value | minimum value | maximum value | risk when dimension <min. value | risk when dimension >max. value |
|---|---|---|---|---|---|
| aperture width 312 W | 50 μm | 40 μm | 60 μm | poor cleaning efficiency, residue remains; poor electrical contact between RDL 320 & stack 340 | damage to stack 340 |
| recess depth 352 D | — | 10 μm | constrained by thicknesses 356, 357 | insufficient stress balance above/below stack 340 | moisture penetration |
| recess width 352 W | 0.8 × (width 341) | 50 μm | ~80-100 μm, constrained by widths 341, 355 | insufficient stress balance above/below stack 340 | moisture penetration, insufficient structural integrity |
| sidewall width 355 | — | 10 μm | device dependent | moisture penetration | |
| inner-dam thickness 356 | — | 10 μm | constrained by thickness 357, depth 352 D | moisture penetration | insufficient stress balance above/below stack 340 |
| outer-dam thickness 357 | 40 μm | 20 μm | 60 μm | layer 360 touches active element 302 | weaker die strength from high cavity aspect ratio |

Conductive stack 340 spans both aperture 312 and recess 352 in directions parallel to the x-y plane of coordinate system 398. A first region of conductive stack 340 is between lines 312A and 312A' illustrating aperture width 312W of aperture 312 at bottom surface 330B. This first region spans aperture 312. A second region of conductive stack 340 is between lines 352A and 352A' illustrating recess width 352W of recess 352. This second portion spans recess 352 and includes the first portion.

Dielectric layer 310 has an inner surface 317 and conductive stack has an outer surface 347. While FIGS. 3 and 4 illustrate a gap between surfaces 317 and 347, surfaces 317 and 347 may be adjoining such that there is no gap therebetween.

Figure 5:
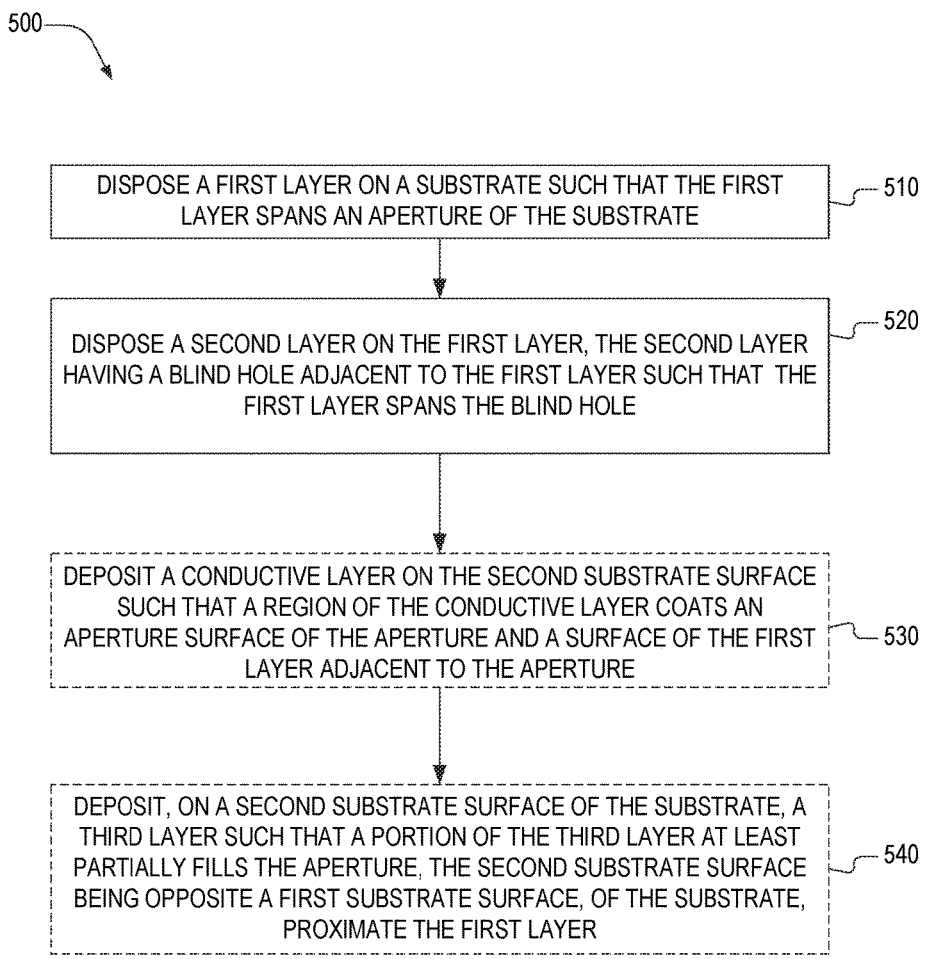
FIG. 5 is a flowchart illustrating a first method for preventing delamination of adjacent layers of a multilayer structure, in an embodiment.

FIG. 5 is a flowchart illustrating a method 500 for preventing delamination of adjacent layers of a multilayer structure. Method 500 includes steps 510 and 520.

Step 510 is one of disposing a first layer on a substrate such that the first layer spans an aperture of the substrate. In an example of step 510, conductive stack 340 is disposed on semiconductor layer 330 such that conductive stack 340 spans aperture 312 of semiconductor layer 330. For example, the region of conductive stack 340 between lines 312A and 312A' spans aperture 312. Conductive stack 340 may be disposed via a physical vapor deposition process, such as thermal evaporation.

Step 520 is one of disposing a second layer on the first layer, the second layer having a blind hole adjacent to the first layer such that the first layer spans the blind hole. In an example of step 520, dam 350 is disposed on conductive stack 340 such that the region of conductive stack 340 between lines 352A and 352A' spans recess 352.

Method 500 may also include steps 530 and 540, in which the substrate has a first substrate surface, proximate the first layer, and a second substrate surface thereopposite. Step 530 is one of depositing a conductive layer on the second substrate surface such that a region of the conductive layer coats an aperture surface of the aperture and a surface of the first layer adjacent to the aperture. In an example of step 530, RDL 320 is deposited on surface 330T such that a region of RDL coats aperture surface 312S and top surface 340T of conductive stack 340.

Step 540 is one of depositing, on a second substrate surface of the substrate, a third layer such that a portion of the third layer at least partially fills the aperture, the second substrate surface being opposite a first substrate surface, of the substrate, proximate the first layer. In an example of step 540, dielectric layer 310 is deposited on surface 330T such that a portion of dielectric layer partially fills aperture 312.

Figure 6:
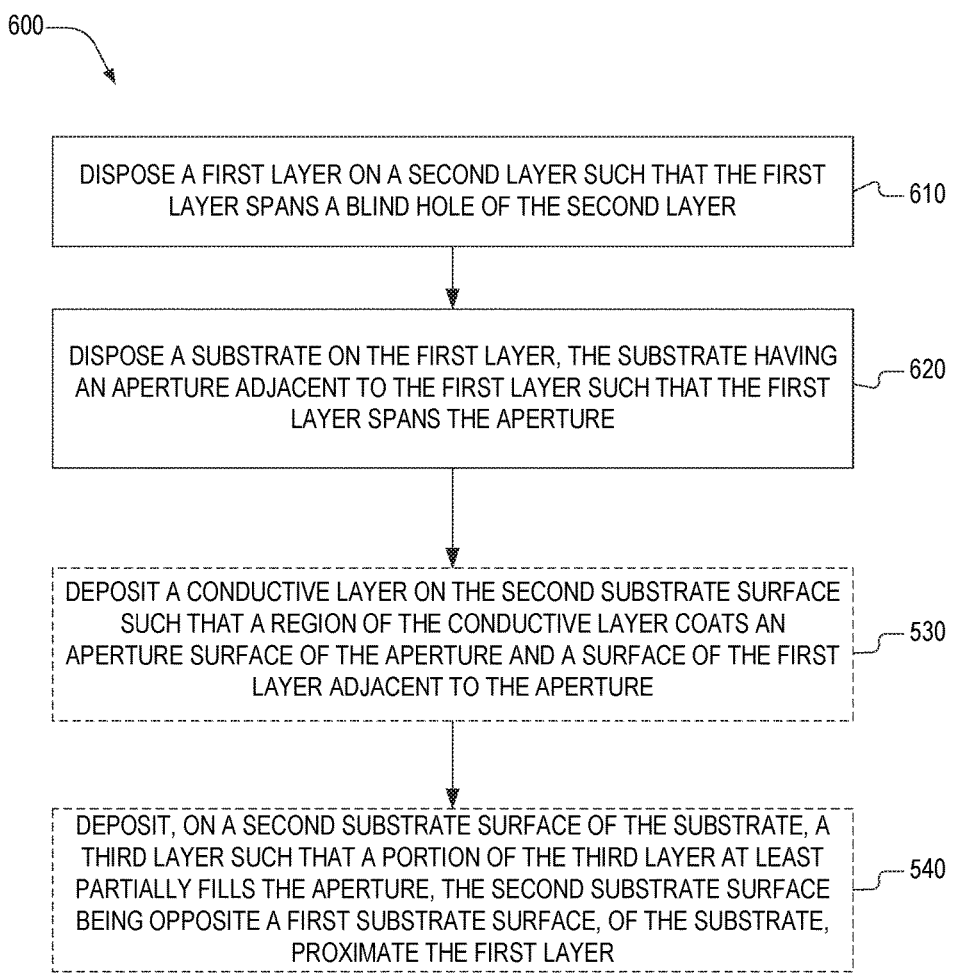
FIG. 6 is a flowchart illustrating a second method for preventing delamination of adjacent layers of a multilayer structure, in an embodiment.

FIG. 6 is a flowchart illustrating a method 600 for preventing delamination of adjacent layers of a multilayer structure. Method 600 includes steps 610 and 620.

Step 610 is one of disposing a first layer on a second layer such that the first layer spans a blind hole of the second layer. In an example of step 610, conductive stack 340 is disposed on dam 350 such that conductive stack 340 spans recess 352.

Step 620 is one of disposing a substrate on the first layer, the substrate having an aperture adjacent to the first layer such that the first layer spans the aperture and includes at least part of the first portion. In an example of step 620, semiconductor layer 330 is disposed on conductive stack 340 such that the region of conductive stack 340 between lines 312A and 312A' spans aperture 312.

Method 600 may also include steps 530 and 540 described above regarding method 500. Steps 530 and 540 and examples thereof as applied to method 600 are the same as those described in the context of method 500.

Combinations of Features

Features described above as well as those claimed below may be combined in various ways without departing from the scope hereof. The following examples illustrate some possible, non-limiting combinations:

(A1) A delamination-resistant semiconductor device includes a conductive layer, a semiconductor layer, and a spacer. The conductive layer has a first side opposite a second side. The semiconductor layer is on the first side and defines an aperture therethrough spanned by the conductive layer. The spacer is on the second side and has a top surface, proximate the conductive layer, that defines a blind hole spanned by the conductive layer.

(A2) The delamination-resistant semiconductor device denoted by (A1) may further include a redistribution layer on a surface of the semiconductor layer within the aperture and electrically connected to the conductive layer.

(A3) The delamination-resistant semiconductor device denoted by (A2) may further include a dielectric layer at least partially filling the aperture, a region of the redistribution layer being between the semiconductor layer and the dielectric layer.

(A4) Any delamination-resistant semiconductor device denoted by one of (A1) through (A3) may further include a dielectric layer at least partially filling the aperture.

(A5) In any delamination-resistant semiconductor device denoted by one of (A1) through (A4), the conductive layer may include a stack of conductive layers interspersed with dielectric layers.

(A6) In any delamination-resistant semiconductor device denoted by one of (A1) through (A5), the blind hole may have a depth of at least ten micrometers.

(A7) In any delamination-resistant semiconductor device denoted by one of (A1) through (A6), in a direction perpendicular to the top surface, the spacer may have a minimum thickness, within the blind hole, exceeding ten micrometers.

(A8) In any delamination-resistant semiconductor device denoted by one of (A1) through (A7), the blind hole may have a width equal to or exceeding a width of the aperture proximate the conductive layer.

(A9) In any delamination-resistant semiconductor device denoted by one of (A1) through (A8), the spacer being formed of an electrical insulator.

(B1) A method for preventing delamination of a multilayer structure, includes a step of disposing a first layer on a substrate such that the first layer spans an aperture of the substrate. The method also includes a step of disposing a second layer on the first layer. The second layer has a blind hole adjacent to the first layer such that the first layer spans the blind hole.

(B2) The method denoted by (B1), in which the substrate has a first substrate surface proximate the first layer and a second substrate surface thereopposite, may also include a step of depositing, on the second substrate surface, a third layer such that a portion of the third layer at least partially fills the aperture.

(B3) Any method denoted by one of (B1) and (B2), in which the substrate has a first substrate surface, proximate the first layer, and a second substrate surface thereopposite, may further include a step of depositing a conductive layer on the second substrate surface such that a region of the conductive layer coats an aperture surface of the aperture and a surface of the first layer adjacent to the aperture.

(B4) In any method denoted by one of (B1) through (B3), the second layer may be formed of an electrical insulator.

(C1) A method for preventing delamination of a multilayer structure includes disposing a first layer on a second layer such that the first layer spans a blind hole of the second layer. The method also includes disposing a substrate on the first layer, in which the substrate has an aperture adjacent to the first layer such that the first layer spans the aperture.

(C2) The method denoted by (C1), in which the substrate has a first substrate surface, proximate the first layer, and a second substrate surface thereopposite, and may further include depositing, on the second substrate surface, a third layer such that a portion of the third layer at least partially fills the aperture.

(C3) Any method denoted by one of (C1) and (C2), in which the substrate has a first substrate surface, proximate the first layer, and a second substrate surface thereopposite, may further include a step of depositing a conductive layer on the second substrate surface such that a region of the conductive layer coats an aperture surface of the aperture and a surface of the first layer adjacent to the aperture.

(C4) In any method denoted by one of (C1) through (C3), the second layer may be formed of an electrical insulator.

Without departing from the scope hereof, changes may be made in the above delamination-resistant semiconductor devices and method for preventing delamination of a multilayer structures, methods and systems. It should thus be noted that the matter contained in the above description or shown in the accompanying drawings should be interpreted as illustrative and not in a limiting sense. The following claims are intended to cover all generic and specific features described herein, as well as all statements of the scope of the present delamination-resistant semiconductor devices and method for preventing delamination of a multilayer structures, which, as a matter of language, might be said to fall therebetween.

What is claimed is:

1. A delamination-resistant semiconductor device comprising:
    a conductive layer having a first side opposite a second side;
    a semiconductor layer on the first side and defining an aperture therethrough spanned by the conductive layer; and
    a spacer on the second side and having a top surface proximate the conductive layer that defines a blind hole spanned by the conductive layer.

2. The delamination-resistant semiconductor device of claim 1, further comprising a redistribution layer on a surface of the semiconductor layer within the aperture and electrically connected to the conductive layer.

3. The delamination-resistant semiconductor device of claim 2, further comprising a dielectric layer at least partially filling the aperture, a region of the redistribution layer being between the semiconductor layer and the dielectric layer.

4. The delamination-resistant semiconductor device of claim 1, further comprising a dielectric layer at least partially filling the aperture.

5. The delamination-resistant semiconductor device of claim 1, the conductive layer including a stack of conductive layers interspersed with dielectric layers.

6. The delamination-resistant semiconductor device of claim 1, the blind hole having a depth of at least ten micrometers.

7. The delamination-resistant semiconductor device of claim 1, in a direction perpendicular to the top surface, the spacer having a minimum thickness, within the blind hole, exceeding ten micrometers.

8. The delamination-resistant semiconductor device of claim 1, the blind hole having a width equal to or exceeding a width of the aperture proximate the conductive layer.

9. The delamination-resistant semiconductor device of claim 1, the spacer being formed of an electrical insulator.

10. A method for preventing delamination of a multilayer structure, comprising:
 disposing a first conductive layer on a semiconductor substrate such that the first conductive layer spans an aperture of the semiconductor substrate; and
 disposing a second layer on the first conductive layer, the second layer having a blind hole adjacent to the first conductive layer such that the first conductive layer spans the blind hole.

11. The method of claim 10, the semiconductor substrate having a first substrate surface, proximate the first conductive layer, and a second substrate surface thereopposite, and further comprising:
 depositing, on the second substrate surface, a third layer such that a portion of the third layer at least partially fills the aperture.

12. The method of claim 10, the semiconductor substrate having a first substrate surface, proximate the first conductive layer, and a second substrate surface thereopposite, and further comprising:
 depositing a conductive layer on the second substrate surface such that a region of the conductive layer coats an aperture surface of the aperture and a surface of the first conductive layer adjacent to the aperture.

13. The method of claim 10, in the step of disposing a second layer, the second layer being formed of an electrical insulator.

14. A method for preventing delamination of a multilayer structure, comprising:
 disposing a first conductive layer on a second layer such that the first conductive layer spans a blind hole of the second layer; and
 disposing a semiconductor substrate on the first conductive layer, the semiconductor substrate having an aperture adjacent to the first conductive layer such that the first conductive layer spans the aperture.

15. The method of claim 14, the semiconductor substrate having a first substrate surface, proximate the first conductive layer, and a second substrate surface thereopposite, and further comprising:
 depositing, on the second substrate surface, a third layer such that a portion of the third layer at least partially fills the aperture.

16. The method of claim 14, the semiconductor substrate having a first substrate surface, proximate the first conductive layer, and a second substrate surface thereopposite, and further comprising:
 depositing a conductive layer on the second substrate surface such that a region of the conductive layer coats an aperture surface of the aperture and a surface of the first conductive layer adjacent to the aperture.

17. The method of claim 14, the second layer being formed of an electrical insulator.

* * * * *